United States Patent

Takeda

[11] Patent Number: 5,962,187
[45] Date of Patent: *Oct. 5, 1999

[54] RADIATION SENSITIVE COMPOSITION

[75] Inventor: Takashi Takeda, Shizuoka, Japan

[73] Assignee: Clarient International Ltd., Muttenz, Switzerland

[ * ] Notice: This patent issued on a continued prosecution application filed under 37 CFR 1.53(d), and is subject to the twenty year patent term provisions of 35 U.S.C. 154(a)(2).

[21] Appl. No.: 08/955,453

[22] Filed: Oct. 21, 1997

[30] Foreign Application Priority Data

Oct. 25, 1996 [JP] Japan .................................. 8-284293

[51] Int. Cl.$^6$ .................................................. G03C 1/492
[52] U.S. Cl. ......................................................... 430/270.1
[58] Field of Search ................................... 430/270.1, 331

[56] References Cited

U.S. PATENT DOCUMENTS

| | | | |
|---|---|---|---|
| 5,302,487 | 4/1994 | Arneth et al. | 430/157 |
| 5,420,331 | 5/1995 | Ueda et al. | 558/268 |
| 5,426,017 | 6/1995 | Johnson et al. | 430/331 |
| 5,458,921 | 10/1995 | Briguglio et al. | 427/385.5 |
| 5,612,303 | 3/1997 | Takayanagi et al. | 510/174 |
| 5,629,135 | 5/1997 | Kobayashi et al. | 430/270.1 |

FOREIGN PATENT DOCUMENTS

| | | |
|---|---|---|
| 0 410 277 | 1/1991 | European Pat. Off. . |
| 0 634 696 | 1/1995 | European Pat. Off. . |
| 4-9063 | 1/1992 | Japan . |
| 152155 | 6/1995 | Japan . |
| 9205780 | 7/1992 | Rep. of Korea . |

OTHER PUBLICATIONS

English translation of JP 4–9063, 1992.

*Primary Examiner*—Janet Baxter
*Assistant Examiner*—Rosemary Ashton
*Attorney, Agent, or Firm*—Foley & Lardner

[57] ABSTRACT

A radiation sensitive composition containing resist materials such as quinonediazido photo active compound and alkali soluble resin, and a mixed solvent comprising (A) 1 to 25% by weight of propylene glycol derivatives as represented by the formula:

$$R_1-O-CH_2CH(CH_3)-O-R_2$$

wherein $R_1$ and $R_2$ are hydrogen atom, alkyl group having 2 to 5 carbons and acetyl group, and total number of carbons in $R_1$ and $R_2$ is less than 8, both the $R_1$ and $R_2$ are not hydrogen atom at the same time, and (B) 75 to 99% by weight of at least one kind of solvent selected from propylene glycol monomethyl ether acetate and ethyl lactate. The radiation sensitive composition is used for the manufacturing of semiconductor device and liquid crystal display element. The solvent is safe to human body and the amount of residual solvent in the resist film is small.

3 Claims, No Drawings

RADIATION SENSITIVE COMPOSITION

BACKGROUND OF THE INVENTION

1. Field of the Invention

The present invention relates to a radiation sensitive composition (which will be referred to as "a resist composition" hereinafter) which is sensitive to radiation such as ultraviolet rays, deep ultraviolet rays, X-rays, and corpuscular beams such as electron beams and so on, and more particularly, to a resist composition which has high safety in use, good application, low film thickness loss at the time of development, uniformity in line width of pattern after development and good resist adhesion to substrate during development.

2. Description of the Related Art

In manufacturing an integrated circuit, a color filter, a liquid crystal display element and the like, a fine or minute manufacturing technique is required, to meet such requirement, a resist composition is conventionally utilized. As the resist composition there are conventionally known positive type and negative type. Both the resists are dissolved by solvent into solution. This resist composition is applied to a substrate such as a silicon substrate and a glass substrate by a known application method such as spin coating and roller coating, and is then prebaked to form a resist film. After that the resist film is exposed to ultraviolet rays, deep ultraviolet rays, X-rays or corpuscular beams such as electron and the like beams in accordance with the photosensitive wave range of a resist material to be used and is developed. After that, dry etching is performed if necessary and a desired resist pattern is formed. Various types of solvents are conventionally known as a solvent used for the above described resist composition, and a suitable solvent is selected and used in view of solubility, application, sensitivity, development property and characteristics of pattern to be formed. On the other hand, apart from properties such as resist forming characteristic and the like, many solvents have a problem in view of safety to human body. Recently attention to the safety to human body has especially been paid, and it is the fact that a solvent is selected in view of the safety. For example, ethylene glycol monoethyl ether acetate had been known as a solvent which was excellent in various properties such as solubility, application and resist forming characteristic. But after the problem of safety to human body was pointed out, ethylene glycol monoethyl ether acetate has not been used at all as a solvent for the resist composition. Alternatively, propylene glycol monomethyl ether acetate has mainly been used as a safe solvent. Other than propylene glycol monomethyl ether acetate, there are known safe solvents such as ethyl lactate and methyl-n-amyl ketone and the like. However, these solvents having high safety as compared with ethylene glycol monoethyl ether acetate have a problem that properties such as resist forming characteristic are not sufficient. For example, in the case of propylene glycol monomethyl ether acetate, when the resist composition is applied onto the substrate for forming a resist film, an amount of residual solvent in the film at the time of film formation are large, and there are problems such as that reduction rate of film thickness, uniformity of line width and adhesion of resist film at the time of development are deteriorated. Reasons for such deterioration are that although the propylene glycol monomethyl ether acetate itself is a solvent having high evaporation speed, if it is used as a solvent of the resist composition, evaporation only around the surface of the coating is took place and a so-called film is formed on the surface of the coating and thus solvent involved under the surface is prone not to evaporate. For this reason, a solvent having high safety and good resist forming characteristic at the same time is required.

SUMMARY OF THE INVENTION

The present invention is for solving the above described problems in the view of giving weight to the safety, and it is an object of the present invention to provide a resist composition of which the amount of the residual solvent in a resist film at the time of resist film formation is decreased, and properties such as reduction rate of film thickness, uniformity of line width and adhesion of the resist film at the time of development are improved.

The above object of the present invention is achieved by providing a resist composition using, as a solvent, a mixed solvent comprising;

(A) 1 to 25% by weight of propylene glycol derivative as represented by the general formula I:

wherein $R_1$ and $R_2$ represent independently hydrogen atom, alkyl group having 2 to 5 carbons and acetyl group, and total number of carbons in $R_1$ and $R_2$ is less than 8, both $R_1$ and $R_2$ are not hydrogen atom at the same time, and (B) 75 to 99% by weight of at least one kind of solvent selected from propylene glycol monomethyl ether acetate and ethyl lactate.

DETAILED DESCRIPTION AND THE PREFERED EMBODIMENT

Examples of propylene glycol derivatives shown in the above mentioned general formula I are propylene glycol monopropyl ether, propylene glycol mono-n-butyl ether, propylene glycol mono-t-butyl ether, propylene glycol monoethyl ether acetate, propylene glycol diacetate and the like. Among them, propylene glycol mono-n-butyl ether is desirable. It is confirmed that from descriptions in MSDS (Material Safety Data Sheet) these materials are solvents that the toxicity is low and the safety is high. The propylene glycol derivative can be used individually or in combination of 2 or more kinds.

Further, concerning content of the propylene glycol derivatives in the solvent which are shown in the above general formula I, if the content in the solvent is smaller than 1% by weight, the resist forming characteristic is not improved so much, and if the content is greater than 25% by weight, the resist forming characteristic may be deteriorated as compared with major solvent alone depending upon the type of the major solvent. For this reason, the content of the propylene glycol derivatives in the solvent shown in the general formula I is preferably in the range of 1 to 25% by weight, and more preferably in the range of 1 to 20% by weight.

On the other hand, examples of solvent which constitutes a major ingredient of the solvent are propylene glycol monomethyl ether acetate or ethyl lactate. They are used individually or in combination as a major solvent if required. Among the solvents used as a major solvent, propylene glycol monomethyl ether acetate is desirable in view of improvement of characteristics.

The amount of the solvent used consisting of the major solvent and propylene glycol derivatives which are shown in the general formula I with respect to the resist varies depending upon the type of resist and major solvent which is used. But the amount of the solvent used is usually in a range of 50 to 3,000 parts by weight with respect to 100 parts by weight of solid content of a resist composition, and preferably in a range of 70 to 2,000 parts by weight, and more preferably in a range of 100 to 1,000 parts by weight.

A resist ingredient in the resist composition of the present invention may be of known positive type or negative type resist. Typical examples of the positive type resist which can be used as a resist in the present invention are a resist comprising quinonediazido photo active compound and alkali soluble resin, and a chemically amplified type resist. Typical examples of the negative type resist are a resist containing a polymer having a photo-sensitive group such as polyvinyl cinnamate, a resist containing aromatic azido compound, a resist containing azido compound comprising cyclized rubber and bisazido compound, a resist containing diazo resin, a photopolymerization composition containing addition polymerization unsaturated compound, and a chemically amplified negative type resist comprising alkali soluble resin, cross-linking agent, and photo acid generator.

A preferable example as a resist material used in the present invention is one comprising quinonediazido photo active compound and alkali soluble resin. There are various known positive type resists comprising quinonediazido photo active compound and alkali soluble resin, and any of them may be used in the present invention, and type of such resist is not limited.

Examples of the quinonediazido photo active compound used in the positive type resist comprising quinonediazido photo active compound and alkali soluble resin are: 1,2-benzoquinonediazido-4-sulfonic acid, 1,2-naphthoquinone diazido-4-sulfonic acid, 1,2-naphthoquinonediazido-5-sulfonic acid, and esters or amides of the above described sulfonic acid. The esters or amides of sulfonic acid can be obtained by a condensation reaction of quinonediazido sulfonic acids or quinonediazido sulfonyl chlorides, and compounds containing hydroxyl group or a compound containing amino group. Examples of the compound containing hydroxyl group are: dihydroxy benzophenone, trihydroxy benzophenone, tetrahydroxy benzophenone, phenol, naphthol, p-methoxyphenol, bisphenol A, pyrocatechol, pyrogallol, pyrogallol methyl ether, gallic acid, $\alpha$, $\alpha'$, $\alpha''$-tris (4-hydroxyphenyl)-1,3,5-tri-isopropylbenzene, tris (hydroxyphenyl)methane, and the like. Examples of the compound containing amino group are: aniline, p-aminodiphenyl amine and the like. The quinonediazido photo active compound can be used individually or in combination as a mixture of two or more agents.

On the other hand, examples of alkali soluble resin are: novolak resin, polyvinyl phenol, polyvinyl alcohol, copolymer of acrylic acid or methacrylic acid. Examples of the novolak resin are condensation polymerization products between aldehydes such as formaldehyde, paraformaldehyde and the like, and one kind or more kinds of phenols such as phenol, o-cresol, m-cresol, p-cresol, xylenol, trimethylphenol, t-butylphenol, ethyl phenol, 2-naphthol, 1,3-dihydroxynaphthalene and the like. The alkali soluble resin such as novolak resin can be used in combination of two or more kinds if required. Further, in order to improve the film formation characteristic, other resin can be added. Moreover, esters prepared from condensation polymerization products between phenols and aldehydes or ketones, and quinonediazido sulfonic acids can be used as the ester of quinonediazido sulfonic acid.

Although the suitable mixture ratio between quinonediazido photo active compound and alkali soluble resin varies depending upon the kinds of photo active compound and alkali soluble resin which are actually used, a preferable range is usually 1:1 to 1:20 in weight ratio. However, the present invention is not limited to such range.

The chemically amplified type resist is also one of positive type resists which can preferably be used in the present invention. As exposing the chemically amplified type resist to radiation, acid is formed in it, and the acid acts as a catalyst for changing the solubility of the resist with respect to developer. Then the resist of the exposed area is dissolved out by developer and positive patterns are formed.

The chemically amplified type resist includes a photo acid generator which generates acid by exposing to the radiation, and a resin containing an acid-labile group which is decomposed into alkali soluble group such as phenolic hydroxyl group or carboxyl group in the presence of acid.

Examples of the photo acid generator are: bissulfonyl diazomethanes such as bis(isopropylsulfonyl)diazomethane; bissulfonyl methanes such as methylsulfonyl p-toluenesulfonyl methane; sulfonyl carbonyl diazomethanes such as cyclohexylsulfonyl cyclohexylcarbonyl diazomethane; sulfonyl carbonyl alkanes such as 2-methyl-2-(4-methylphenylsulfonyl) propiophenone; nitrobenzyl sulfonates such as 2-nitrobenzyl p-toluene sulfonate; alkyl or aryl sulfonates such as pyrogallol trismethane sulfonate; benzoin sulfonates such as benzoin tosylate; N-sulfonyl oxyimides such as N-(trifluoromethylsulfonyloxy) phthalimide; pyrrolidones such as (4-fluoro-benzenesulfonyloxy)-3, 4, 6-trimethyl-2-pyridone; sulfonic acid esters, such as 2, 2, 2-trifluoro-1-trifluoromethyl-1-(3-vinylphenyl)ethyl-4-chlorobenzene sulfonate; onium salts such as triphenyl sulfonium methane sulfonate. These compounds can be used individually or in combination of two or more kinds.

The resin containing acid-labile group which is decomposed into alkali soluble group such as phenolic hydroxyl group or carboxyl group in the presence of acid is composed of acid-labile group which is decomposed in the presence of acid and alkali soluble resin portion having alkali soluble group. Examples of the acid-labile group are: substituted methyl group such as benzyl group; 1-substituted ethyl group such as 1-methoxyethyl group, 1-benzyloxyethyl group; 1-branched alkyl group such as t-butyl group; silyl group such as trimethylsilyl group; germyl group such as trimethyl germyl group; alkoxycarbonyl group such as t-butoxycarbonyl group; acyl group such as acetyl group; and cyclic acid-decomposable group such as tetrahydropyranyl group, tetrahydrofuranyl group, tetrahydrothiopyranyl group, and tetrahydrothiofuranyl group. Among the above-described groups, preferable ones are benzyl group, t-butyl group, t-butoxycarbonyl group, tetrahydropyranyl group, tetrahydrofuranyl group, tetrahydrothiopyranyl group, and tetrahydrothiofuranyl group.

Moreover, examples of alkali soluble resin which possesses alkali soluble group such as phenolic hydroxyl group or carboxyl group are polymer or copolymer prepared from vinyl monomer such as: hydroxystyrene, hydroxy-$\alpha$-methylstyrene, hydroxymethylstyrene, vinyl benzoic acid, carboxymethylstyrene, carboxymethoxystyrene, acrylic acid, methacrylic acid, crotonic acid, maleic acid, itaconic acid, citraconic acid, mesaconic acid, and cinnamic acid. Further, copolymer with at least one of the above described monomers and other monomer, as well as condensation polymerization resin such as novolak resin will be usable.

Further, as chemically amplified type resists, in addition to the above described resist, one containing alkali soluble resin, photo acid generator, and compound which is decomposed under the existence of acid in order to low the dissolution-controlling-effect of the alkaline soluble resin or promote the solubility of it may be used.

These resist materials are dissolved by above described solvents into resist compositions. To the resist compositions, it is possible to add various known additives such as surfactants, sensitizing agents and the like.

Although it is possible to use the resist composition according to the present invention for various application such as manufacturing semiconductor device or the like, it is preferable to use the resist composition as a photoresist composition for manufacturing integrated circuit or liquid crystal display element. A resist pattern is formed using the resist composition of the present invention in the following manner:

First, the resist composition of the present invention is produced by dissolving a resist material with a solvent which is describes above. Insoluble matters are removed from the produced resist composition by filtration if necessary and the resultant composition is applied to a substrate such as a silicon substrate and a glass substrate by known application method such as spin coating, roller coating, reverse roller coating, casting and doctor coating, such that a thickness of the film after pre-baking becomes, for example, 0.01 to 1,000 $\mu$m.

The resist composition which has been applied to the substrate is prebaked, for example, on a hot plate to remove the solvent, thus a resist film is formed. The temperature for pre-baking varies depending upon the kind of solvent or resist. But the temperature for pre-baking is usually in a range of 30 to 200° C., and more preferable, in a range of about 50 to 150° C.

After the resist film is formed, an exposure to radiation is conducted. Because radiation-sensitive wavelength regions of the resist vary depending upon a resist used, the exposure is conducted by using an exposure source which is suitable to the radiation-sensitive wavelength region of the resist. As the light sources, known irradiation devices such as a high pressure mercury lamp, a metal halide lamp, an ultimate high pressure mercury lamp, a KrF excimer laser, a soft X-ray beams generator, and an electron beam writers are used, and exposure of desired patterns are conducted through the mask, if necessary, by using, for example, ultraviolet rays, deep ultraviolet rays, X-rays or electron beams. After the exposure, in order to improve the developing properties, the resolution, the pattern shape and the like, post exposure bake is conducted if necessary. After the post exposure bake the development is conducted. Further, after the development, if necessary, in order to remove the anti-reflection coating and the like, a dry etching is conducted by means of gas plasma, and the resist pattern is formed.

The development of the above-mentioned resist is performed by using usual developing solution and making use of the difference in solubility between exposed area and unexposed area with respect to solvent or alkaline solution. Examples of alkaline developing solution which can be used are water solution or aqueous solution of inorganic or organic alkali compounds. The examples of alkali compounds are inorganic alkali compounds such as sodium hydroxide, potassium hydroxide, sodium carbonate and sodium silicate; amines such as ammonia, ethylamine, diethylamine, triethylamine, diethylethanolamine, triethanolamine, and benzylamine; amides such as formamide; quaternary ammonium salts such as tetramethylammonium hydroxide (TMAH), tetraethylammonium hydroxide and choline; cyclic amines such as pyrrole and piperazine.

The present invention will be described in more detail by way of Examples and Comparative examples, but it should be noted that the invention is not limited to the Examples.

EXAMPLES 1 TO 5, COMPARATIVE EXAMPLES 1 AND 2

Resist compositions for Examples 1 to 5 and Comparative examples 1 and 2 are provided in the following manner:

That is, 24 parts by weight of quinonediazido photo active compound and 100 parts by weight of novolak resin mentioned below were dissolved in the solvent having composition shown in each of the boxes of Examples and Comparative examples in Table 1, so that solids content thereof becomes 25% by weight.

Quinonediazido photo active compound:
  esterification product of 2,3,4,4'-tetrahydroxy benzophenone and 1,2-naphthoquinonediazido-5-sulfonyl chloride.

Novolak resin:
  condensation polymerization compound of m-cresol/p-cresol=4/6 and formaldehyde

TABLE 1

| | Resist solvent (mixture ratio by weight) |
|---|---|
| Example 1 | PGMEA: PnB = 98:2 |
| Example 2 | PGMEA: PnB = 95:5 |
| Example 3 | PGMEA: PnB = 90:10 |
| Example 4 | PGMEA: PnB = 80:20 |
| Example 5 | PGMEA: PGEEA = 75:25 |
| Comparative example 1 | PGMEA |
| Comparative example 2 | PGMEA: PnB = 70:30 |

(In Table 1, PGMEA represents propylene glycol monomethyl ether acetate, PnB represents propylene glycol mono-n-butyl ether, and PGEEA represents propylene glycol monoethyl ether acetate.)

Based on the resist compositions obtained in the above described manner, residual solvent rate in the resist film after baking, amount of reduction of film thickness in unexposed area after development, uniformity of line width of pattern after development and adhesion of the resist pattern to substrate after development were measured by methods described in (1) to (4) shown below, and results shown in Tables 2 to 5 were obtained.

(1) Residual Solvent Rate

A thickness of a resist film which is actually applied and formed on a substrate is thin and absolute amount of solvent in the resist film is small. Moreover a considerable amount of solvent evaporates even during spin-coating before pre-baking and the evaporation speed of the solvent is fast. Therefore, it is difficult to measure directly the residual amount of solvent in the resist film. For this reason, the residual solvent rate in the resist film after pre-baking was calculated by conducting a mimetic test which will be described below. That is, 2.0000 g of the seven kinds of the resist compositions of Examples 1 to 5 and Comparative examples 1 and 2 were taken out, and each of them was placed on a bottom of an aluminum laboratory dish having the same diameter such that each of the compositions covers the bottom of the laboratory dishes uniformly. Then the laboratory dishes were heated on a hot plate for 2 to 30 minutes at 100° C., a weight of each of the laboratory dishes was measured, and the residual solvent rates were calculated by the following equation:

Residual solvent rate={(entire weight after heating for a given time)−(weight of aluminum laboratory dish)−(weight of solid ingredient of the resist composition)}×100/(weight of solvent before heating)

Here, because the weight of the resist composition used in this test is 2.0000 g and the solid content of the resist composition is 25% by weight, the weight of solid ingredient of the resist composition is 0.5000 g and the weight of the solvent before heating is 1.5000 g. Results of the above calculation are shown in Table 2 below.

TABLE 2

| | Heating time (minute) | | | | | |
|---|---|---|---|---|---|---|
| | 2 | 5 | 10 | 15 | 20 | 30 |
| Example 1 | 77.41 | 54.55 | 36.35 | 28.74 | 25.43 | 21.36 |
| Example 2 | 77.53 | 54.72 | 36.47 | 28.19 | 24.88 | 20.64 |
| Example 3 | 77.90 | 55.17 | 36.81 | 28.19 | 25.08 | 20.78 |
| Example 4 | 80.12 | 55.73 | 37.20 | 29.30 | 26.66 | 22.22 |
| Example 5 | 77.45 | 54.42 | 36.32 | 29.02 | 25.88 | 21.94 |
| Comparative example 1 | 77.30 | 52.87 | 36.25 | 31.05 | 27.80 | 23.72 |
| Comparative example 2 | 88.34 | 58.13 | 40.02 | 32.63 | 30.48 | 27.56 |

The above described test for obtaining the residual solvent rate is mimetic because the resist is applied on the substrate much thicker as compared with that of the actual or usual resist film. Therefore, the heating time of this test should not be considered the same as the baking time of the actual process. However, the heating condition in this test such that the solvent content is relatively low, for example the residual solvent rate becomes 30% by weight or less and adhesion to the substrate during development is kept well is similar to the actual baking condition. In the above described test, it seems to be possible to compare and check the Examples and Comparative examples concerning the data of heating time of 15 minutes or more. By the results shown above, it has been confirmed that as to the residual solvent rate which was baked for practical time in which the residual solvent rate becomes 30% by weight or less, Examples have lower values than Comparative examples do, and that Examples have superior evaporating characteristic. The reason which can be considered is that by mixing, in an appropriate amount, PnB and PGEEA which are the propylene glycol derivatives shown in the general formula I with PGMEA or EL, a degree of film forming on a resist film surface becomes low and the solvent is smoothly evaporated.

(2) Amount of Reduction of Film Thickness in Unexposed Area

The seven kinds of the resist compositions of Examples 1 to 5 and Comparative examples 1 and 2 were spin-coated on a silicon substrate of four inches such that a film thickness after pre-baking becomes 1.5 μm, and were prebaked on a direct hot plate for 90 seconds at 100° C. Then, these compositions were developed by a developing solution containing 2.38% by weight of TMAH for 60 seconds to measure the amount of reduction of film thickness in unexposed area. The result is shown in Table 3.

TABLE 3

| | Amount of reduction of film thickness in unexposed area (Å) |
|---|---|
| Example 1 | 353 |
| Example 2 | 323 |
| Example 3 | 327 |
| Example 4 | 345 |
| Example 5 | 370 |
| Comparative example 1 | 382 |
| Comparative example 2 | 428 |

As is apparent from Table 3, the resist compositions according to the present invention are improved in an amount of reduction of film thickness in unexposed area as compared with that of Comparative example 1 in which PGMEA is used alone as a solvent or that of Comparative example 2 in which a mixed solvent of PGMEA and PnB at a ratio of 70:30 (weight ratio) is used.

(3) Uniformity of Line Width of Pattern After Development

The seven kinds of the resists of Examples 1 to 5 and Comparative examples 1 and 2 were spin-coated on a glass wafer of four inches such that a film thickness after pre-baking becomes 1.5 μm, and were prebaked on a direct hot plate for 90 seconds at 100° C. Then, the resists were exposed by g-line stepper at an exposure amount such that a ratio of the width of line and space becomes 1:1. Thereafter, the resist-coated substrates were developed for 60 seconds to measure the line width of 100 lines of 5 μm on the surface of the substrate, then a standard deviation σ of uniformity of the line width was calculated. The results are shown in Table 4.

TABLE 4

| | σ (μm) |
|---|---|
| Example 1 | 0.263 |
| Example 2 | 0.167 |
| Example 3 | 0.175 |
| Example 4 | 0.238 |
| Example 5 | 0.282 |
| Comparative example 1 | 0.361 |
| Comparative example 2 | 0.402 |

As is apparent from Table 4, the resist compositions according to the present invention are smaller in unevenness of line width as compared with that of Comparative example 1 in which PGMEA is used alone as a solvent and that of Comparative example 2 in which a mixed solvent of PGMEA and PnB at a ratio of 70:30 (weight ratio) is used. Therefor, reproducibility of the pattern is superior.

(4) Adhesion of Resist Pattern to Substrate After Development

The seven kinds of the resists of Examples 1 to 5 and Comparative examples 1 and 2 were spin-coated on silicon nitride substrates such that a film thickness after pre-baking becomes 1.5 μm, and were prebaked on a direct hot plate for 90 seconds at 100° C. Then, the resists were exposed by g-line stepper at an exposure amount such that a ratio of the width of line and space becomes 1:1. Thereafter, the resist-coated substrates were developed for 60, 90 and 120 seconds, respectively, using a dipping method to observe whether or not the lack of the pattern is generated by mean of an optical microscope. The results are shown in Table 5.

TABLE 5

| | Developing time (seconds) | | |
|---|---|---|---|
| | 60 | 90 | 120 |
| Example 1 | ○ | ○ | ○ |
| Example 2 | ○ | ○ | ○ |
| Example 3 | ○ | ○ | ○ |
| Example 4 | ○ | ○ | ○ |
| Example 5 | ○ | ○ | ○ |
| Comparative example 1 | ○ | X | X |
| Comparative example 2 | ○ | X | X |

(In Table 5, ○ means that there was no lack of pattern after developing, and X means that some lacks of patters were occurred after developing.)

As is apparent from Table 5, the resist compositions of the present inventions are all superior in adhesion of patterns to substrate.

Meanwhile, it can be found from Tables 2 to 5 that resist compositions having 1 to 25% by weight of propylene glycol derivative based on the total weight of solvents have improved characteristics, and among them, resist compositions which use propylene glycol monomethyl ether acetate as a main solvent, and contain 3 to 15% by weight of propylene glycol mono-n-butyl ether based on the total weight of solvents provide excellent results.

As described above, the resist composition of the present invention is superior in safety to human body, solubility, and applicability property of resist and is improved in residual solvent rate in the resist film. Therefore, an amount of reduction of film thickness in unexposed area at the time of development is small, and adhesion property of the resist at the time of development is also superior. Further, the resist composition of the present invention has an excellent effect that unevenness in line width of the developed pattern is small and excellent pattern can be formed, which is useful especially as a photoresist composition for manufacturing semiconductor devices, liquid crystal display elements, or the like.

What is claimed is:

1. A radiation sensitive composition comprising, as a solvent, a mixed solvent consisting of;

(A) 1 to 25% by weight of propylene glycol derivative represented by the formula I:

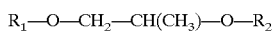

$R_1$—O—$CH_2$—$CH(CH_3)$—O—$R_2$ wherein $R_1$ and $R_2$ represent independently hydrogen atom, alkyl group having 2 to 5 carbons and acetyl group, and the total number of carbons in $R_1$ and $R_2$ is less than 8, and wherein both the $R_1$ and $R_2$ are not hydrogen atom at the same time, and (B) 75 to 99% by weight of propylene glycol monomethyl ether acetate.

2. A radiation sensitive composition according to claim 1, wherein said propylene glycol derivative is propylene glycol mono-n-butyl ether.

3. A radiation sensitive composition according to claim 1, wherein in formula I, $R_1$ is a $C_2$ to $C_5$ alkyl and $R_2$ is hydrogen.

* * * * *